United States Patent
Chen et al.

(10) Patent No.: US 9,668,372 B2
(45) Date of Patent: May 30, 2017

(54) CABLE MANAGEMENT DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 14/966,304

(22) Filed: Dec. 11, 2015

(65) Prior Publication Data
US 2016/0330859 A1    Nov. 10, 2016

(30) Foreign Application Priority Data
May 5, 2015    (TW) .............. 104114358 A

(51) Int. Cl.
| | | |
|---|---|---|
| *F16L 3/00* | (2006.01) | |
| *H05K 7/14* | (2006.01) | |
| *F16L 3/015* | (2006.01) | |
| *H02G 11/00* | (2006.01) | |

(52) U.S. Cl.
CPC ............ *H05K 7/1491* (2013.01); *F16L 3/015* (2013.01); *H02G 11/00* (2013.01)

(58) Field of Classification Search
CPC .......... H02G 3/32; H02G 3/30; H02G 3/0608; H02G 3/26; H02G 3/0456; H02G 3/263; H02G 3/0418; H02G 3/22; H02G 3/0437; H02G 3/0443; H02G 11/00; H02G 3/0487; H02G 11/006; H02G 3/045; H02G 3/0431; F16L 55/035; F16L 3/22; F16L 3/13; F16L 3/222; F16L 3/04; F16L 3/221; F16L 3/233; F16L 3/23; F16L 3/227; F16L 3/1075; F16L 3/26; F16L 3/137; F16L 3/02; F16L 3/127; F16L 3/12; F16L 3/00
USPC ....... 248/49, 65, 68.1, 73; 211/26; 174/72 A
See application file for complete search history.

(56) References Cited

U.S. PATENT DOCUMENTS

| | | | |
|---|---|---|---|
| 5,746,389 A * | 5/1998 | Willmann | B65H 75/36 174/69 |
| 6,070,742 A | 6/2000 | McAnally et al. | |
| 6,972,949 B1 | 12/2005 | Helgenberg et al. | |
| 7,258,583 B1 | 8/2007 | Baiza | |
| 9,332,669 B1 * | 5/2016 | Chen | H05K 7/1491 |
| 9,370,121 B2 * | 6/2016 | Chen | H05K 7/1491 |
| 2010/0181440 A1 * | 7/2010 | Larsen | F16L 3/015 248/68.1 |
| 2012/0188725 A1 | 7/2012 | Masuda | |

(Continued)

*Primary Examiner* — Steven Marsh
(74) *Attorney, Agent, or Firm* — Rosenberg, Klein & Lee

(57) ABSTRACT

A cable management device includes a first cable management arm, a second cable management arm, and a rod. The second cable management arm is movably connected to the first cable management arm. The rod is attached between the first cable management arm and the second cable management arm such that an unfolding angle between the first cable management arm and the second cable management arm is kept within a predetermined range.

18 Claims, 13 Drawing Sheets

(56) References Cited

U.S. PATENT DOCUMENTS

| | | | |
|---|---|---|---|
| 2013/0341471 A1* | 12/2013 | Yang | H05K 7/1491 |
| | | | 248/70 |
| 2015/0096952 A1* | 4/2015 | Hall | E21B 15/00 |
| | | | 211/132.1 |
| 2015/0342081 A1* | 11/2015 | Chang | H05K 7/1491 |
| | | | 361/679.02 |

* cited by examiner

CABLE MANAGEMENT DEVICE

FIELD OF THE INVENTION

The present invention relates to a cable management device and more particularly to a cable management device for managing the cables of an object (e.g., a piece of electronic equipment).

BACKGROUND OF THE INVENTION

A slide rail assembly typically includes at least two slide rails which can be longitudinally displaced relative to each other to bring the slide rail assembly into an extended or retracted state. In a rack-based system, for example, a pair of slide rail assemblies can be used to mount a piece of electronic equipment (e.g., a server) to two pairs of posts of a rack so that the electronic equipment can be pulled out of and retracted into the rack via the pair of slide rail assemblies. Generally, the cables of the electronic equipment are arranged on a cable management arm (CMA), which can keep the cables in neat arrangement while the pair of slide rail assemblies are being pulled out or retracted. Techniques related to cable management arms are disclosed, for instance, in U.S. Pat. Nos. 6,945,504 B2; 7,712,615 B2; and 8,231,014 B2, the disclosures of which are incorporated herein by reference.

SUMMARY OF THE INVENTION

The present invention relates to a cable management device for managing the cables of an object.

According to one aspect of the present invention, a cable management device includes a first cable management arm, a second cable management arm, and a first rod. The second cable management arm is movably connected to the first cable management arm. The first rod is attached between the first cable management arm and the second cable management arm and has a first portion and a second portion, wherein the first portion is connected to one of the first cable management arm and the second cable management arm and the second portion can be driven by the other of the first cable management arm and the second cable management arm. Thus, the angle by which the second cable management arm can be unfolded with respect to the first cable management arm is kept within a predetermined range by the first rod.

Preferably, the first cable management arm has a first end portion, and the second cable management arm has a first end portion pivotally connected to an upper part of the first cable management arm that is adjacent to the first end portion of the first cable management arm.

Preferably, the cable management device further includes a third cable management arm and a fourth cable management arm, the fourth cable management arm is pivotally connected to an upper part of the third cable management arm, the second cable management arm further has a second end portion, and the third cable management arm is pivotally connected to an upper part of the second cable management arm that is adjacent to the second end portion of the second cable management arm.

Preferably, the first portion of the first rod is pivotally connected to the first cable management arm, one of the first rod and the second cable management arm further has a first guide groove, and a first guide member is movably mounted in the first guide groove to enable relative movement of the first rod and the second cable management arm.

Preferably, the second portion of the first rod forms a blocking portion at a predetermined position of the first guide groove such that the first guide member can move in the first guide groove only within a range of movement between the first portion of the first rod and the second portion of the first rod.

Preferably, the cable management device further includes a second rod attached between the second cable management arm and the third cable management arm, and the second rod has a first portion and a second portion. The first portion of the second rod is connected to one of the second cable management arm and the third cable management arm. The second portion of the second rod can be driven by the other of the second cable management arm and the third cable management arm. One of the second rod and the third cable management arm further has a second guide groove, and a second guide member is movably mounted in the second guide groove to enable relative movement of the second rod and the third cable management arm. Thus, the angle by which the third cable management arm can be unfolded with respect to the second cable management arm is kept within a predetermined range by the second rod.

Preferably, the second portion of the second rod forms a blocking portion at a predetermined position of the second guide groove such that the second guide member can move in the second guide groove only within a range of movement between the first portion of the second rod and the second portion of the second rod.

Preferably, the cable management device further includes a third rod attached between the third cable management arm and the fourth cable management arm, and the third rod has a first portion and a second portion. The first portion of the third rod is connected to one of the third cable management arm and the fourth cable management arm. The second portion of the third rod can be driven by the other of the third cable management arm and the fourth cable management arm. One of the third rod and the fourth cable management arm further has a third guide groove, and a third guide member is movably mounted in the third guide groove to enable relative movement of the third rod and the fourth cable management arm. Thus, the angle by which the fourth cable management arm can be unfolded with respect to the third cable management arm is kept within a predetermined range by the third rod.

Preferably, the second portion of the third rod forms a blocking portion at a predetermined position of the third guide groove such that the third guide member can move in the third guide groove only within a range of movement between the first portion of the third rod and the second portion of the third rod.

According to another aspect of the present invention, a cable management device for use with a pair of slide rail assemblies includes a first cable management arm, a second cable management arm, a third cable management arm, a first rod, and a second rod. The first cable management arm has a first end portion and a second end portion which are connected to the slide rail assemblies respectively. The second cable management arm has a first end portion and a second end portion. The first end portion of the second cable management arm is movably connected to the first cable management arm at a position adjacent to the first end portion of the first cable management arm. The third cable management arm is movably connected to the second cable management arm at a position adjacent to the second end portion of the second cable management arm. The first rod is attached between the first cable management arm and the second cable management arm and has a first portion and a second portion, wherein the first portion is connected to one of the first cable management arm and the second cable management arm and the second portion can be driven by the other of the first cable management arm and the second cable management arm. Thus, the angle by which the second cable management arm can be unfolded with respect to the first cable management arm is kept within a predetermined range by the first rod. The second rod is attached between the second cable management arm and the third cable management arm and has a first portion and a second portion. The first portion of the second rod is connected to one of the second cable management arm and the third cable management arm. The second portion of the second rod can be driven by the other of the second cable management arm and the third cable management arm.

According to still another aspect of the present invention, a cable management device is adapted for use with a rack-based system, wherein the rack-based system provides a pair of slide rail assemblies for mounting an object to two pairs of posts of a rack. Each of the slide rail assemblies includes a first rail and a second rail longitudinally displaceable relative to the first rail. The first rail of each slide rail assembly is attached to a corresponding pair of posts while the second rail of each slide rail assembly is mounted with the object. The cable management device includes a first cable management arm, a second cable management arm, a third cable management arm, and a fourth cable management arm. The first cable management arm includes a first end portion and a second end portion which correspond to each other, wherein the first end portion and the second end portion are connected to the first rails of the slide rail assemblies respectively. The second cable management arm includes a first end portion and a second end portion which correspond to each other. The first end portion of the second cable management arm is movably connected to the first end portion of the first cable management arm. The third cable management arm includes a first end portion and a second end portion which correspond to each other. The second end portion of the third cable management arm is movably connected to the second end portion of the second cable management arm. The fourth cable management arm includes a first end portion and a second end portion which correspond to each other. The first end portion of the fourth cable management arm is movably connected to the first end portion of the third cable management arm. The second end portion of the fourth cable management arm is connected to one of the second rails of the pair of slide rail assemblies or the object.

One of the advantageous features of applying the present invention is that the cable management device has more than two movably connected cable management arms, and that a rod can be arranged between each two adjacent cable management arms so that relative movement of the two cable management arms is kept within a predetermined range.

DETAILED DESCRIPTION OF THE INVENTION

Figure 1:
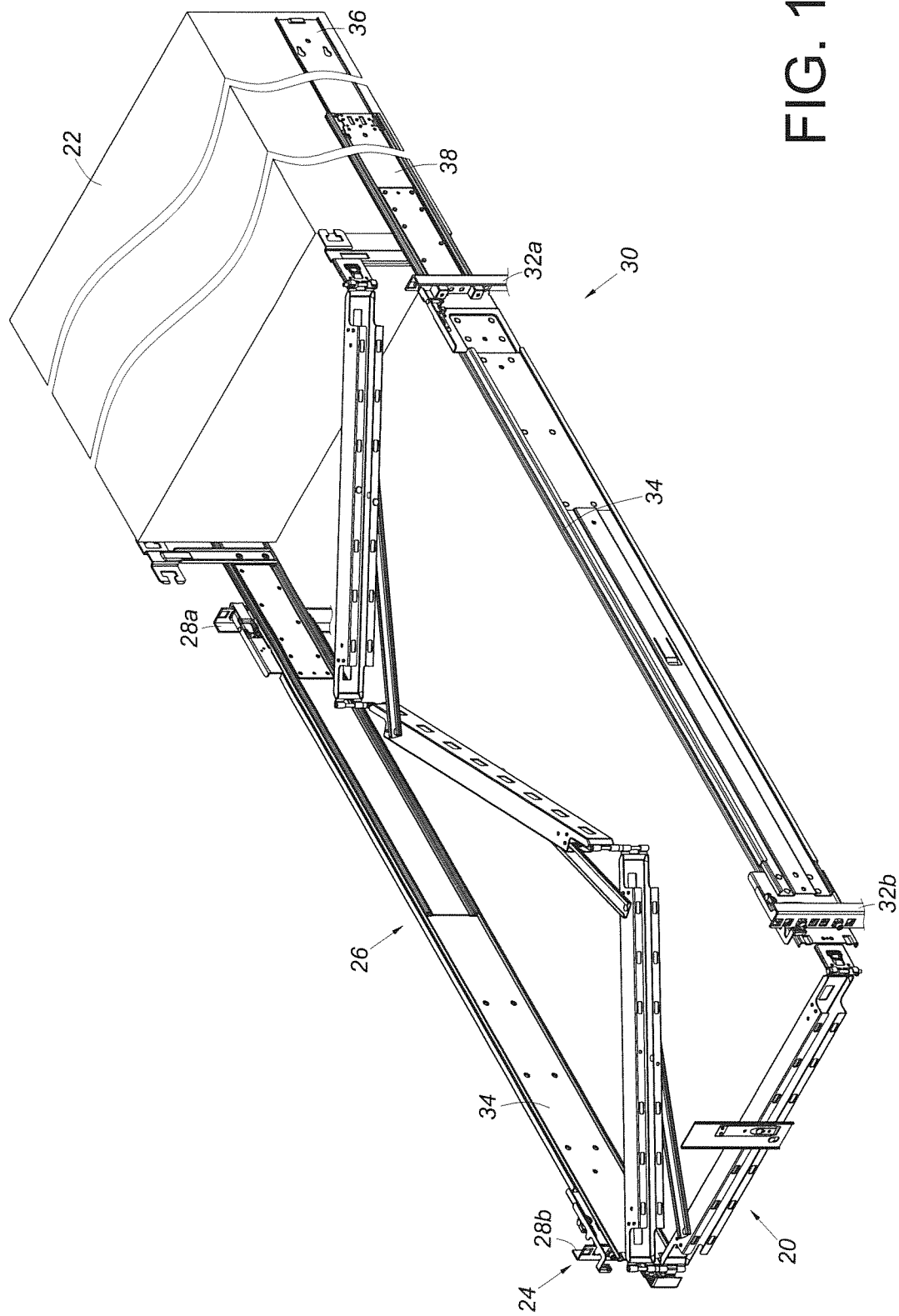
FIG. 1 is a perspective view in which the cable management device in an embodiment of the present invention is applied to a rack-based system and has been brought into an unfolded state by pulling out the second rails of a pair of slide rail assemblies relative to the first rails.
Figure 2:
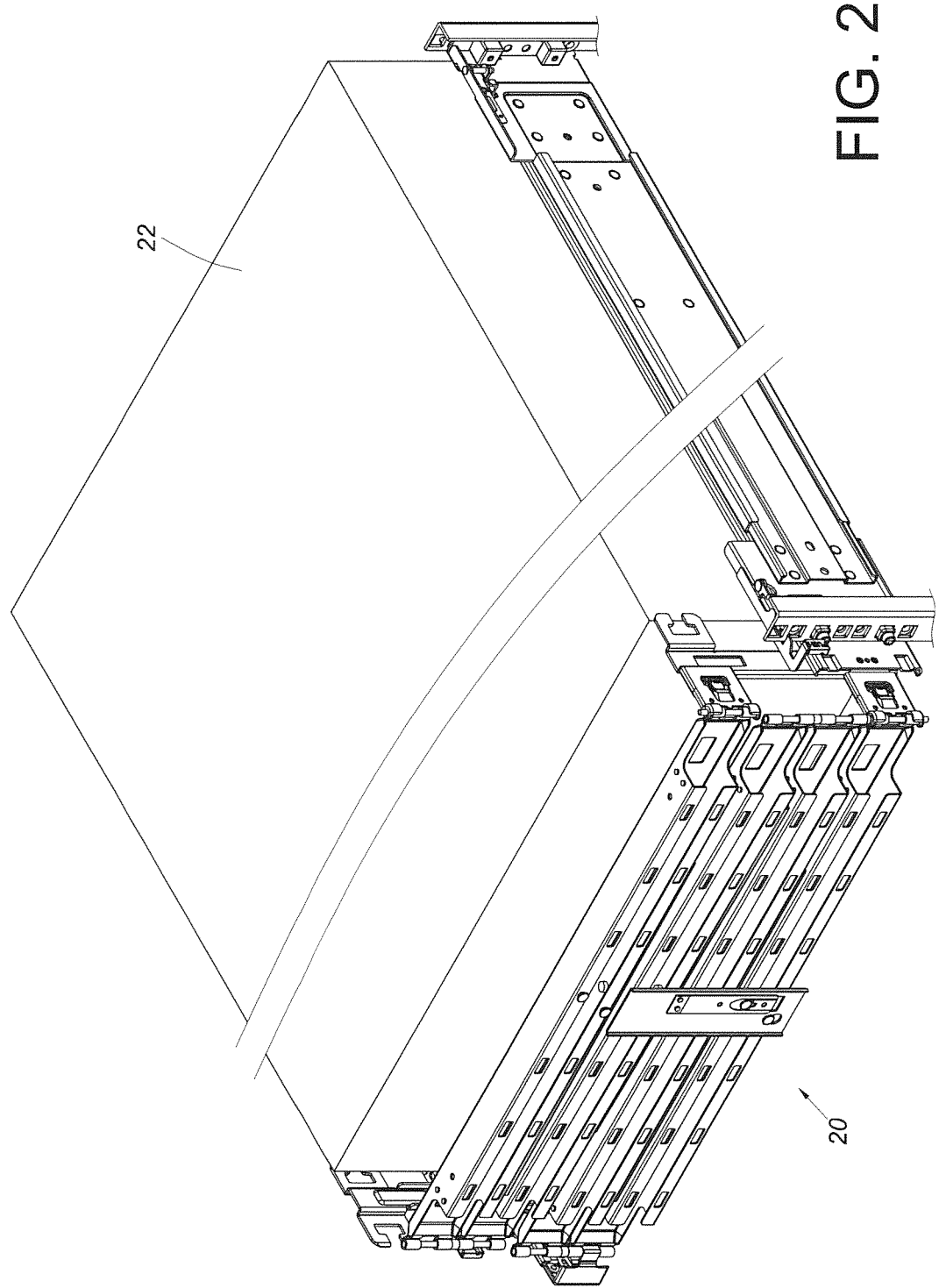
FIG. 2 is a perspective view of the cable management device in FIG. 1 in the folded state.

FIG. 1 shows a cable management device 20 in an embodiment of the present invention. The cable management device 20 is adapted for use with a rack-based system configured to mount an object 22 to a rack 24. The object 22 can be the chassis of a piece of electronic equipment or any other article to be supported in the rack 24; the present invention imposes no limitations in this respect. The object 22 is mounted on two opposite sides to two pairs of posts of the rack 24 via a pair of slide rail assemblies respectively. More specifically, one lateral side of the object 22 is mounted to one pair of posts, e.g., a first post 28a and a second post 28b, via a first slide rail assembly 26, and the opposite lateral side of the object 22 is mounted to the other pair of posts, e.g., a first post 32a and a second post 32b, via a second slide rail assembly 30. Each of the first slide rail assembly 26 and the second slide rail assembly 30 includes a first rail 34 and a second rail 36 longitudinally displaceable relative to the first rail 34, and preferably further includes a third rail 38 movably connected between the first rail 34 and the second rail 36 to increase the distance by which the second rail 36 can be displaced relative to the first rail 34. The first rail 34 of each slide rail assembly is attached to the corresponding pair of posts while the second rail 36 of each slide rail assembly is mounted with the object 22. According to the arrangement described above, the object 22 can be pulled out of and retracted into the rack 24. The cable management device 20 serves to support or store the cables (not shown) extending from and lying behind the object 22. The cable management device 20 can be brought into an unfolded state by pulling the second rails 36 out relative to the first rails 34 and be brought into the folded state as shown in FIG. 2 by retracting the second rails 36 relative to the first rails 34.

Figure 3:
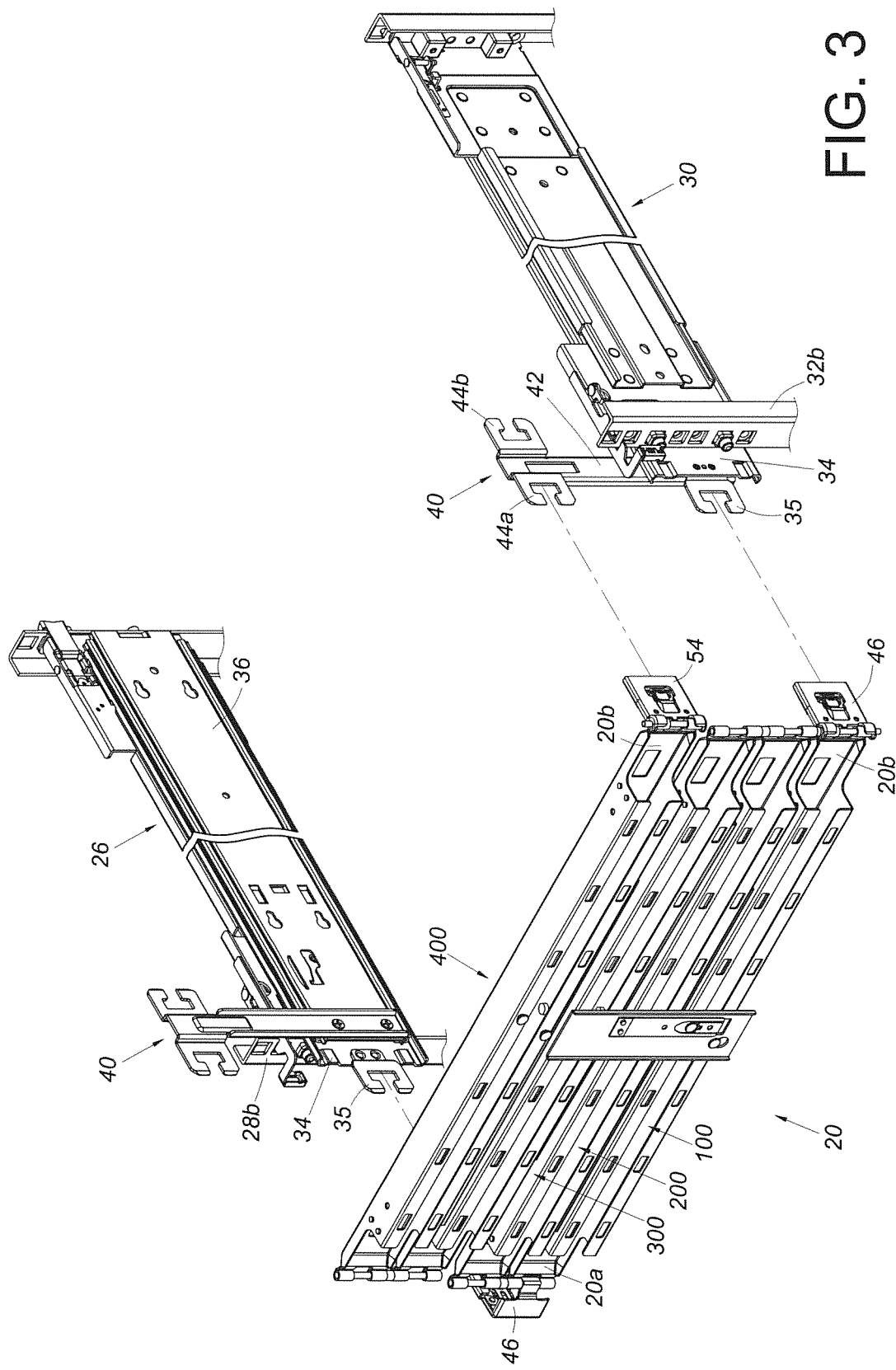
FIG. 3 is an exploded perspective view of the cable management device in an embodiment of the present invention, showing that the first cable management arm can be connected to the first rails of a pair of slide rail assemblies, and that a portion of the fourth cable management arm can be connected to the auxiliary member of the second rail of one of the slide rail assemblies.

Referring to FIG. 3, the cable management device 20 includes at least two cable management arms, such as a first cable management arm 100, a second cable management arm 200, a third cable management arm 300, and a fourth cable management arm 400. When in the folded state, the cable management arms 100, 200, 300, and 400 are stacked together so that more space is available for use in the rack 24. Preferably, the cable management device 20 further includes an auxiliary member 40 mounted to the second rail 36 of one of the first slide rail assembly 26 and the second slide rail assembly 30. The auxiliary member 40 includes an extension base 42 and at least one connecting portion, such as a connecting portion 44a and another connecting portion 44b, both connected to the extension base 42. The extension base 42 has a height. The two connecting portions 44a and 44b extend in different directions so that the auxiliary member 40 is applicable to both the first slide rail assembly 26 and the second slide rail assembly 30. Thanks to the height of the extension base 42, the connecting portion 44a corresponds to the fourth cable management arm 400.

Figure 4:
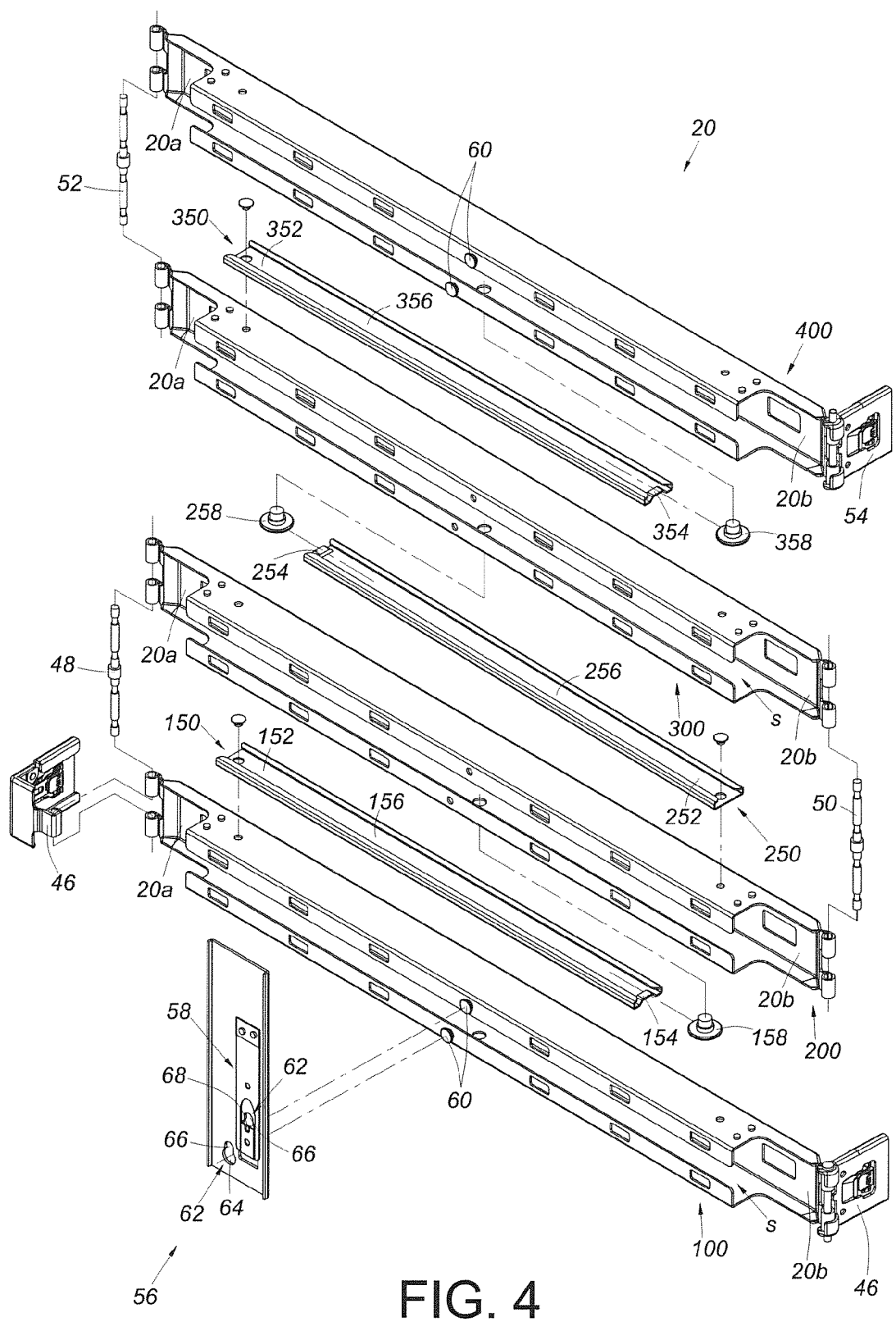
FIG. 4 is an exploded perspective view of the cable management device in an embodiment of the present invention.

As shown in FIG. 3 and FIG. 4, the first cable management arm 100, the second cable management arm 200, the third cable management arm 300, and the fourth cable management arm 400 are all configured to include two corresponding portions, such as a first end portion 20a and a second end portion 20b. Each cable management arm has a cable management feature, such as a receiving space S, between the first end portion 20a and the second end portion 20b, or each cable management arm is attached with a plurality of cable management features arranged between the first end portion 20a and the second end portion 20b at intervals. These cable management features serve to receive and manage the aforesaid cables.

The first end portion 20a and the second end portion 20b of the first cable management arm 100 can be connected to the first rails 34 of the two slide rail assemblies (namely the first slide rail assembly 26 and the second slide rail assembly 30) respectively. At least one of the first and second end portions 20a and 20b of the first cable management arm 100 can be further mounted with a connecting member 46 in a detachable manner. In this embodiment, each of the first and second end portions 20a and 20b of the first cable management arm 100 is connected by a connecting member 46 to a connecting base 35 provided adjacent to a rear portion of the first rail 34 of the corresponding slide rail assembly.

Alternatively, in an embodiment that is not shown, each of the first and second end portions 20a and 20b of the first cable management arm 100 is connected by a connecting member to the corresponding post (e.g., the second post 28b or 32b) of the rack 24. The present invention imposes no limitations in this regard.

The second cable management arm 200 is movably connected to the first cable management arm 100. For instance, the first end portion 20a of the second cable management arm 200 is movably connected to an upper part of the first cable management arm 100 that is adjacent to the first end portion 20a of the first cable management arm 100. More specifically, the first end portion 20a of the second cable management arm 200 is pivotally connected via a first pivotal connecting member 48 to an upper part of the first cable management arm 100 that is adjacent to the first end portion 20a of the first cable management arm 100. As a result, the second cable arrangement arm 200 is arranged at a position higher than the first cable management arm 100.

The third cable management arm 300 is movably connected to the second cable management arm 200. For instance, the second end portion 20b of the third cable management arm 300 is movably connected to an upper part of the second cable management arm 200 that is adjacent to the second end portion 20b of the second cable management arm 200. More specifically, the second end portion 20b of the third cable management arm 300 is pivotally connected via a second pivotal connecting member 50 to an upper part of the second cable management arm 200 that is adjacent to the second end portion 20b of the second cable management arm 200. As a result, the third cable arrangement arm 300 is arranged at a position higher than the second cable management arm 200.

The fourth cable management arm 400 is movably connected to the third cable management arm 300. For instance, the first end portion 20a of the fourth cable management arm 400 is movably connected to an upper part of the third cable management arm 300 that is adjacent to the first end portion 20a of the third cable management arm 300. More specifically, the first end portion 20a of the fourth cable management arm 400 is pivotally connected via a third pivotal connecting member 52 to an upper part of the third cable management arm 300 that is adjacent to the first end portion 20a of the third cable management arm 300. As a result, the fourth cable arrangement arm 400 is arranged at a position higher than the third cable management arm 300. On the other hand, the second end portion 20b of the fourth cable management arm 400 is connected to the second rail 36 of one of the slide rail assemblies (e.g., the first slide rail assembly 26 or the second slide rail assembly 30) or to the object 22. In this embodiment, the second end portion 20b of the fourth cable management arm 400 is further mounted with another connecting member 54 in a detachable manner. This connecting member 54 can connect the second end portion 20b of the fourth cable management arm 400 to the connecting portion 44a of the auxiliary member 40 that is mounted to the second rail 36 (not shown in FIG. 3 due to limitation of the viewing angle) of the second slide rail assembly 30, in order for the fourth cable management arm 400 to be driven by the second rail 36 of the second slide rail assembly 30 when this second rail 36 is displaced relative to the corresponding first rail 34.

Preferably, the cable management device 20 further includes at least one rod which allows two interconnected ones of the cable management arms 100, 200, 300, and 400 to stay within a predetermined range of movement. Here, a first rod 150, a second rod 250, and a third rod 350 are provided by way of example.

The first rod 150 is attached between the first cable management arm 100 and the second cable management arm 200. In this embodiment, the first rod 150 has a first portion 152 and a second portion 154, wherein the first portion 152 is connected (e.g., pivotally connected) to one of the first and second cable management arms 100 and 200 (e.g., the first cable management arm 100) and the second portion 154 can be driven by the other of the first and second cable management arms 100 and 200 (e.g., the second cable management arm 200). Thus, the angle (hereinafter also referred to as the unfolding angle) by which the second cable management arm 200 can be unfolded with respect to the first cable management arm 100 is kept within a predetermined range by the first rod 150. More specifically, one of the first rod 150 and the second cable management arm 200 further has a first guide groove 156. In addition, a first guide member 158 is attached to one of the first rod 150 and the second cable management arm 200. Here, by way of example, it is the first rod 150 that has the first guide groove 156, and the first guide member 158 is attached to the second cable management arm 200 and movably mounted in the first guide groove 156. With the first guide member 158 movably mounted in the first guide groove 156, the first rod 150 and the second cable management arm 200 can move relative to each other. Besides, the second portion 154 forms a blocking portion at a predetermined position of the first guide groove 156 (e.g., the second portion 154 is at a position distant from the first portion 152 of the first rod 150) such that the first guide member 158 can move in the first guide groove 156 only within a range of movement between the first portion 152 and the second portion 154.

The second rod 250 is attached between the second cable management arm 200 and the third cable management arm 300. In this embodiment, the second rod 250 has a first portion 252 and a second portion 254, wherein the first portion 252 is connected (e.g., pivotally connected) to one of the second and third cable management arms 200 and 300 (e.g., the second cable management arm 200) and the second portion 254 can be driven by the other of the second and third cable management arms 200 and 300 (e.g., the third cable management arm 300). Thus, the angle (hereinafter also referred to as the unfolding angle) by which the third cable management arm 300 can be unfolded with respect to the second cable management arm 200 is kept within a predetermined range by the second rod 250.

More specifically, one of the second rod 250 and the third cable management arm 300 further has a second guide groove 256. In addition, a second guide member 258 is attached to one of the second rod 250 and the third cable management arm 300. Here, by way of example, it is the second rod 250 that has the second guide groove 256, and the second guide member 258 is attached to the third cable management arm 300 and movably mounted in the second guide groove 256. With the second guide member 258 movably mounted in the second guide groove 256, the second rod 250 and the third cable management arm 300 can move relative to each other. Besides, the second portion 254 forms a blocking portion at a predetermined position of the second guide groove 256 (e.g., the second portion 254 is at a position distant from the first portion 252 of the second rod 250) such that the second guide member 258 can move in the second guide groove 256 only within a range of movement between the first portion 252 and the second portion 254.

The third rod 350 is attached between the third cable management arm 300 and the fourth cable management arm 400. In this embodiment, the third rod 350 has a first portion 352 and a second portion 354, wherein the first portion 352 is connected (e.g., pivotally connected) to one of the third and fourth cable management arms 300 and 400 (e.g., the third cable management arm 300) and the second portion 354 can be driven by the other of the third and fourth cable management arms 300 and 400 (e.g., the fourth cable management arm 400). Thus, the angle (hereinafter also referred to as the unfolding angle) by which the fourth cable management arm 400 can be unfolded with respect to the third cable management arm 300 is kept within a predetermined range by the third rod 350. More specifically, one of the third rod 350 and the fourth cable management arm 400 further has a third guide groove 356. In addition, a third guide member 358 is attached to one of the third rod 350 and the fourth cable management arm 400. Here, by way of example, it is the third rod 350 that has the third guide groove 356, and the third guide member 358 is attached to the fourth cable management arm 400 and movably mounted in the third guide groove 356. With the third guide member 358 movably mounted in the third guide groove 356, the third rod 350 and the fourth cable management arm 400 can move relative to each other. Besides, the second portion 354 forms a blocking portion at a predetermined position of the third guide groove 356 (e.g., the second portion 354 is at a position distant from the first portion 352 of the third rod 350) such that the third guide member 358 can move in the third guide groove 356 only within a range of movement between the first portion 352 and the second portion 354.

Figure 4A:
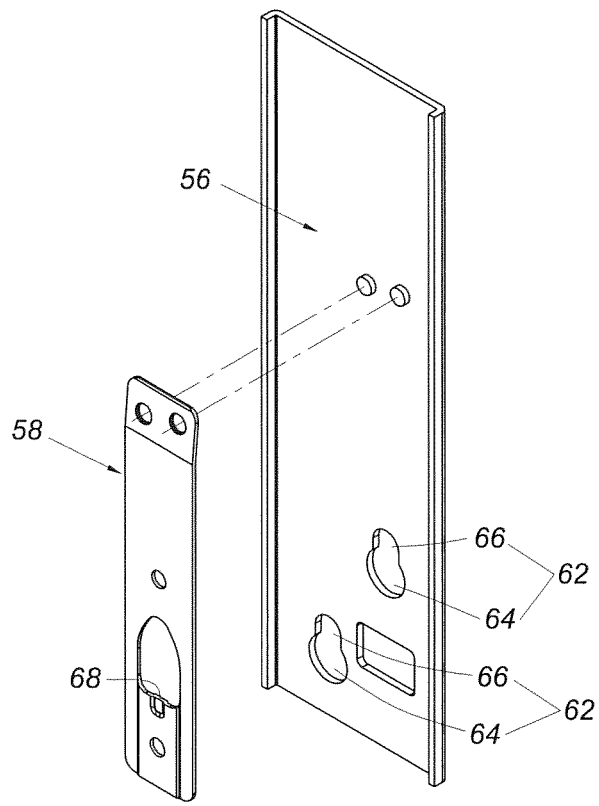
FIG. 4A is an exploded perspective view of the blocking member and the elastic plate in an embodiment of the present invention.

The cable management device 20 may further include a blocking member 56 and an elastic plate 58 provided at the blocking member 56. The blocking member 56 has a height corresponding at least to the stacked height of the first cable management arm 100 and the second cable management arm 200. Here, the height of the blocking member 56 corresponds to the stacked height of the first cable management arm 100, the second cable management arm 200, and the third cable management arm 300 by way of example. The blocking member 56 can produce a blocking effect on the second cable management arm 200 and the third cable management arm 300 while the second cable management arm 200, the third cable management arm 300, and the fourth cable management arm 400 are being folded with respect to the first cable management arm 100. In practice, the height, and consequently the blocking effect, of the blocking member 56 can be adjusted according to practical needs. The blocking member 56 is detachably mounted to one of the first cable management arm 100 and the fourth cable management arm 400. Here, by way of example, the blocking member 56 is mounted to the first cable management arm 100. More specifically, each of the first cable management 100 and the fourth cable management arm 400 can be provided with a plurality of mounting portions 60 for mounting the blocking member 56. The blocking member 56 itself has a plurality of holes 62. As shown in FIG. 4 and FIG. 4A, the elastic plate 58 corresponds to one of the holes 62. Each hole 62 has a large-diameter portion 64 and a small-diameter portion 66 in communication with the large-diameter portion 64 to resemble a keyhole. The elastic plate 58 has a stop wall 68 provided adjacent to the border between the large-diameter portion 64 and the small-diameter portion 66 of the corresponding hole 62. According to the arrangement described above, assembly can be carried out by passing each mounting portion 60 of the first cable management arm 100 through the large-diameter portion 64 of the corresponding hole 62 of the blocking member 56 and then displacing the mounting portions 60 to the small-diameter portions 66 of the holes 62 respectively, with the stop wall 68 of the elastic plate 58 blocking one of the mounting portions 60. Thus, the blocking member 56 is rapidly mounted to the first cable management arm 100. When it is desired to remove the blocking member 56 from the first cable management arm 100, the elastic plate 58 can be pulled in such a way that the stop wall 68 of the elastic plate 58 no longer blocks the mounting portion 60, and then the blocking member 56 can be rapidly detached from the first cable management arm 100.

Figure 5:
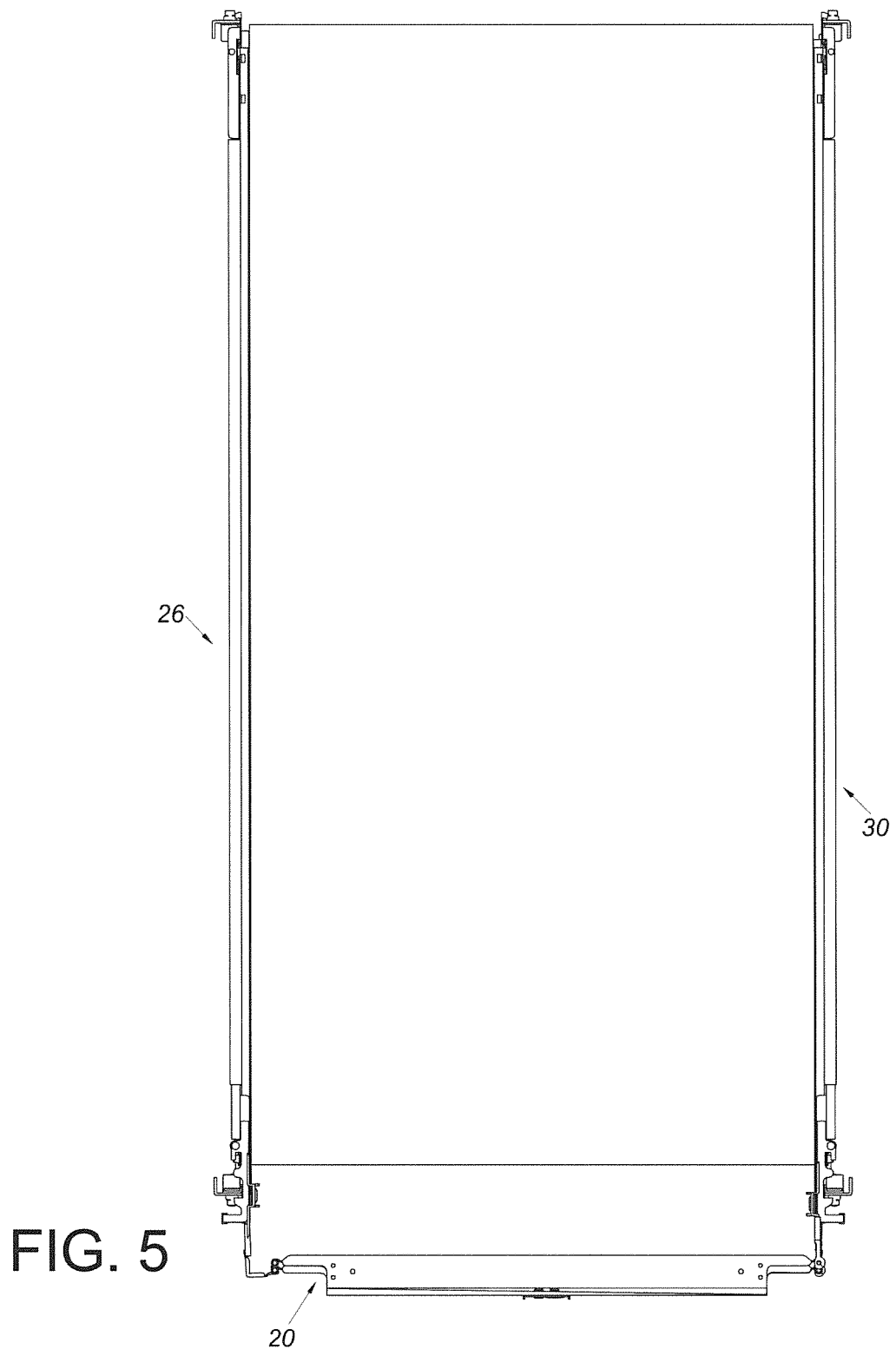
FIG. 5 is a top view in which the cable management device in an embodiment of the present invention is in the folded stated while a pair of slide rail assemblies are in the retracted state.

Referring to FIG. 5, the cable management device 20 is in the folded state when the first slide rail assembly 26 and the second slide rail assembly 30 are in the retracted state.

Figure 6:
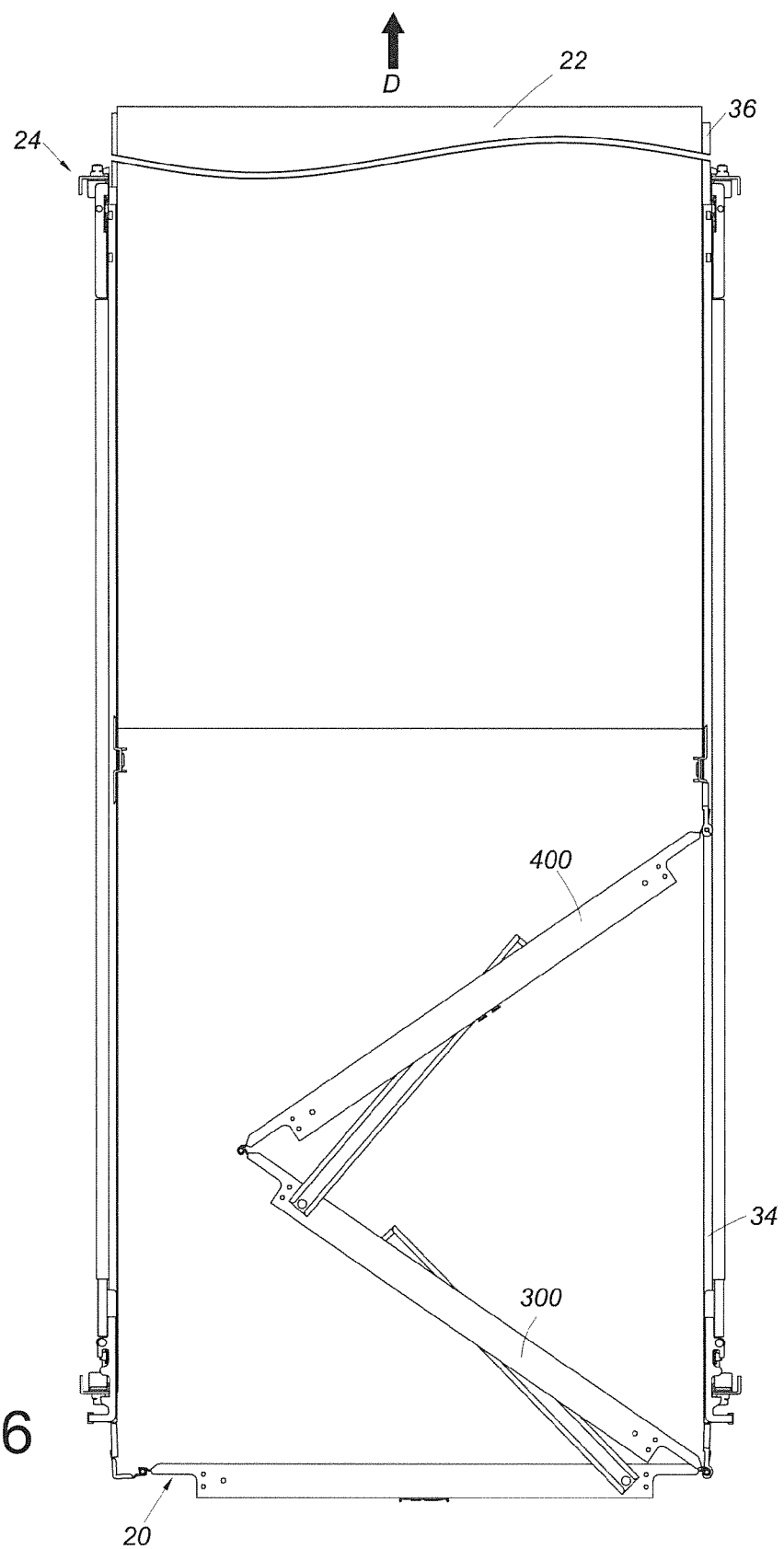
FIG. 6 is a top view showing how the cable management device in FIG. 5 gradually unfolds while an object is pulled via the pair of slide rail assemblies to a position outside a rack.

When the object 22 is displaced by pulling the second rails 36 out of the rack 24 in a direction D relative to the first rails 34, as shown in FIG. 6, the fourth cable management arm 400 of the cable management device 20 is driven to move and gradually unfolds with respect to the third cable management arm 300.

Figure 7:
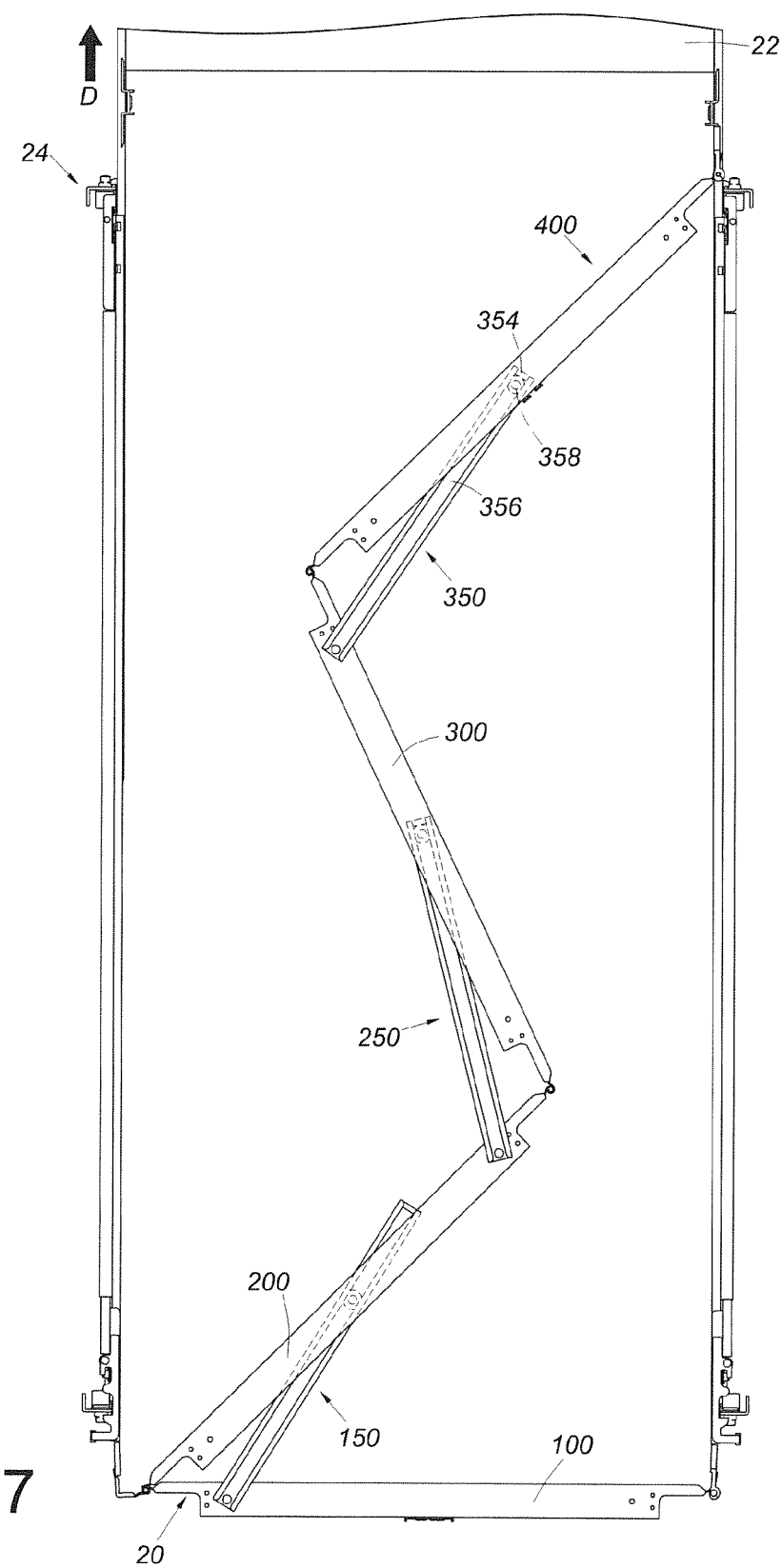
FIG. 7 is a top view showing how the cable management device in FIG. 6 further unfolds while the object is further pulled out of the rack.

The cable management device 20 keeps unfolding when the object 22 is further pulled out in the direction D, as shown in FIG. 7. More specifically, the fourth cable management arm 400 is further moved during the process such that the third cable management arm 300 and the second cable management arm 200 are sequentially driven to displace relative to the first cable management arm 100. Because of the cable management arms 100, 200, 300, and 400, the cable management device 20 can unfold to a greater length than a common two-section cable management arm. Moreover, the first rod 150, the second rod 250, and the third rod 350 can keep relative movement between the first and second cable management arms 100 and 200, between the second and third cable management arms 200 and 300, and between the third and fourth cable management arms 300 and 400 within a predetermined range respectively. Here, the angle of pivotal rotation between each two pivotally connected cable management arms is kept in a predetermined range by the corresponding rod, and this allows the cable management arms 100, 200, 300, and 400 to pivot, and hence shift, within a predetermined range of movement. For example, while the fourth cable management arm 400 is being unfolded with respect to the third cable management arm 300, the third guide member 358 of the fourth cable management arm 400 will be moved in the third guide groove 356 of the third rod 350 until blocked by the second portion 354 of the third rod 350. Once the third guide member 358 is prevented from further displacement in the third guide groove 356, the fourth cable management arm 400 has reached a limit of its range of movement relative to the third cable management arm 300 and therefore can unfold no more with respect to the third cable management arm 300. In this embodiment, for example, the angle by which the fourth cable management arm 400 can pivot with respect to the third cable management arm 300 is kept within a predetermined range by the third rod 350. By the same token, movement of the third cable management arm 300 with respect to the second cable management arm 200 is kept within a predetermined range by the second rod 250 (e.g., the angle by which the third cable management arm 300 can pivot with respect to the second cable management arm 200 is kept within a predetermined range by the second rod 250), and movement of the second cable management arm 200 with respect to the first cable management arm 100 is kept within a predetermined range by the first rod 150 (e.g., the angle by which the second cable management arm 200 can pivot with respect to the first cable management arm 100 is kept within a predetermined range by the first rod 150). The operation of the first and second rods 150 and 250 is similar to that of the third rod 350 and for the sake of simplicity will not be described repeatedly.

Figure 8:
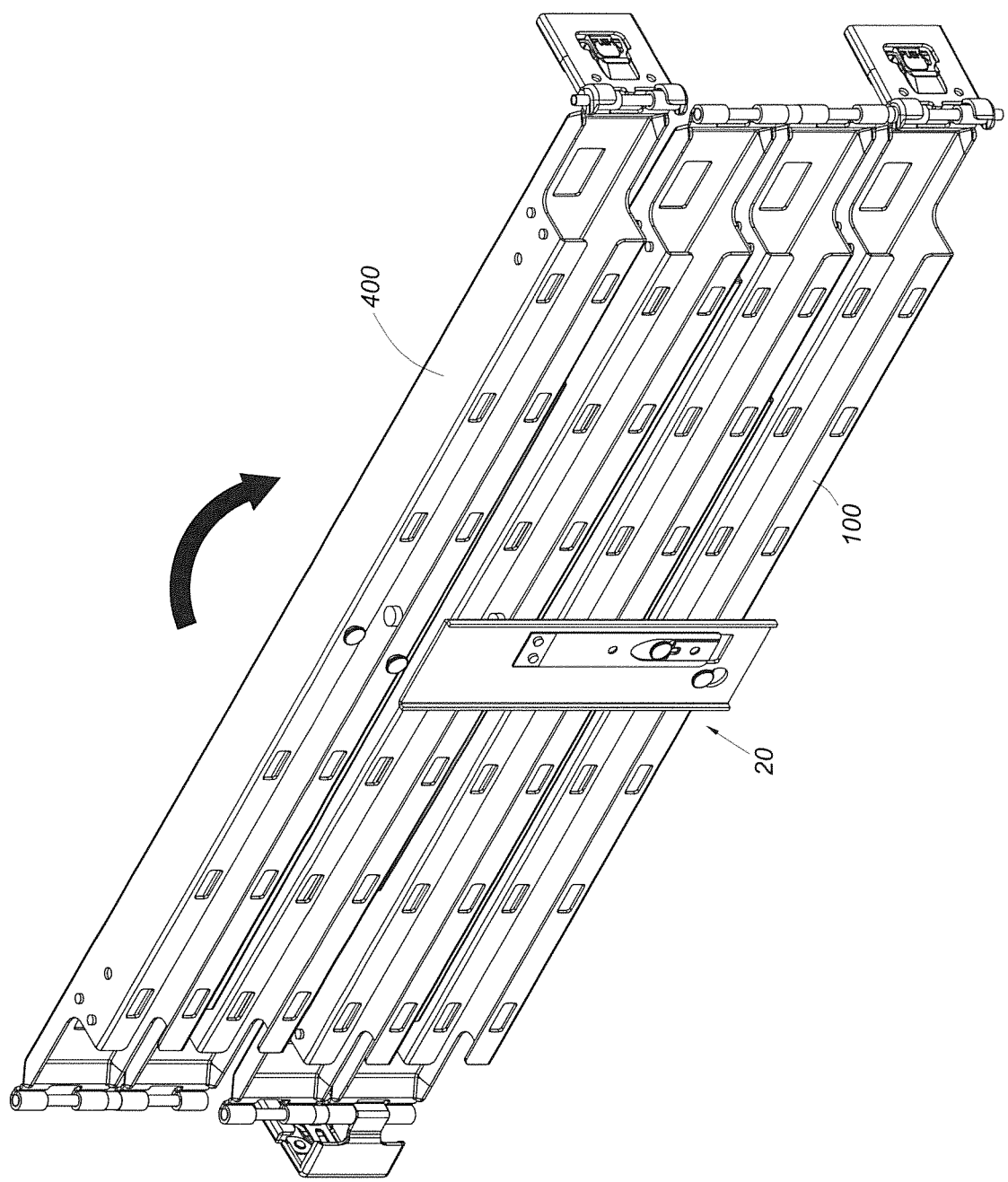
FIG. 8 is a perspective view in which the cable management device in an embodiment of the present invention is in the folded state, showing that the cable management device can also be turned upside down for installation.
Figure 9:
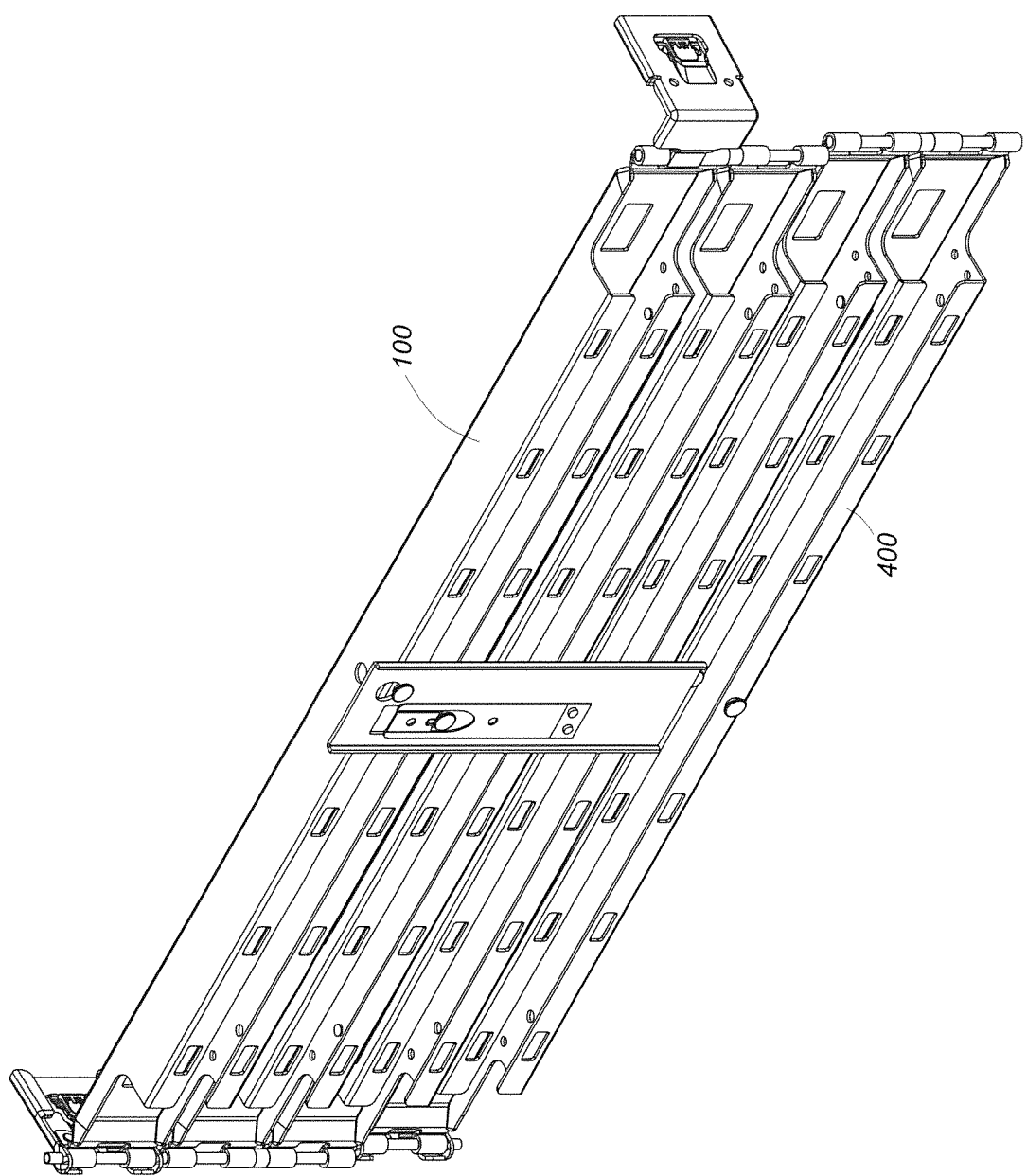
FIG. 9 is a perspective view of the cable management device in FIG. 8 after it is turned upside down, with the cable management arms stacked in a reverse order.

Referring to FIG. 8 and FIG. 9, the cable management device 20 can be installed in a different way from described above. For example, the cable management device 20 can be turned 180 degrees such that the first cable management arm 100 is moved from the bottom layer to the top layer and the fourth cable management arm 400, from the top layer to the bottom layer.

Figure 10:
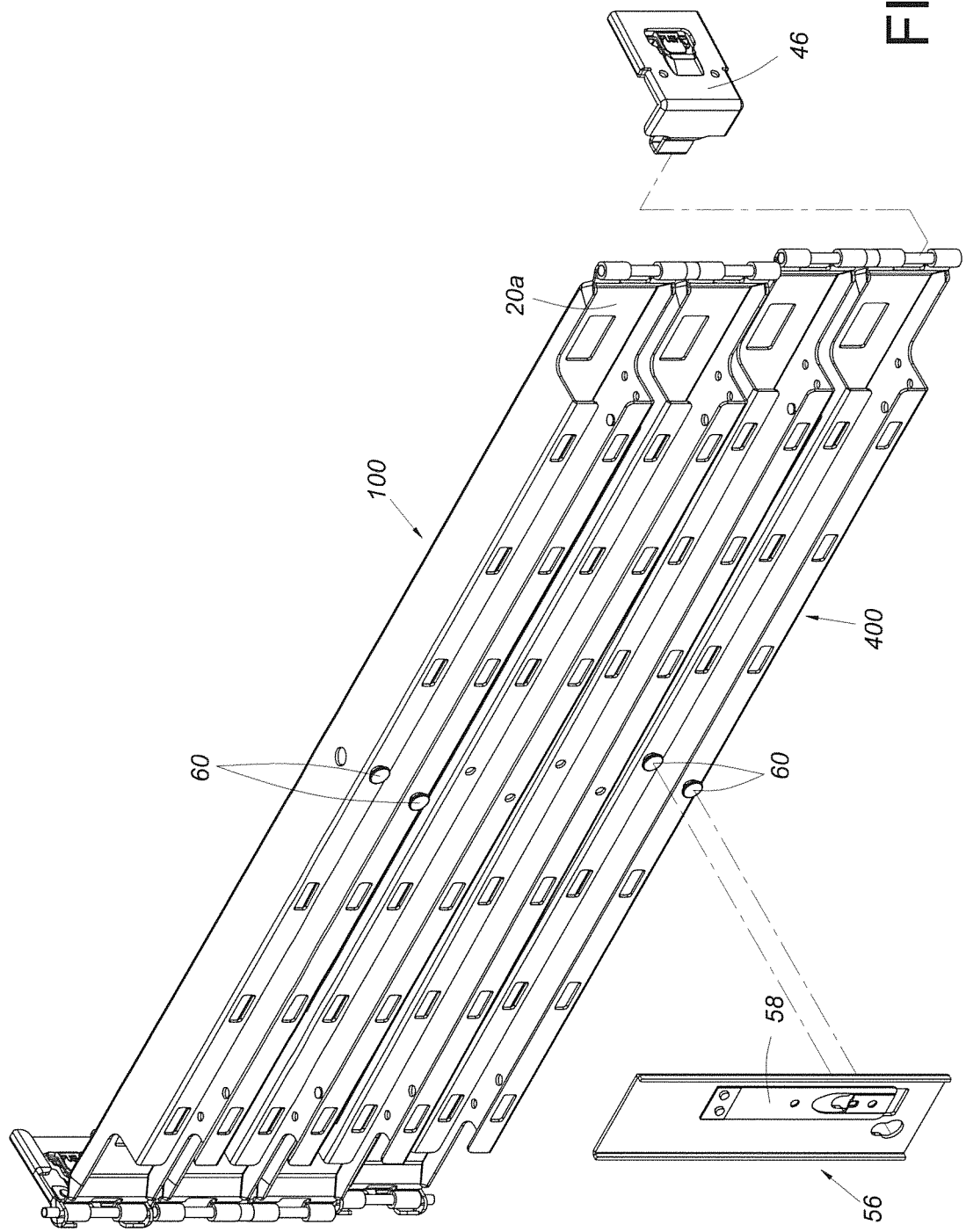
FIG. 10 is another perspective view of the cable management device in FIG. 8 after it is turned upside down, with the blocking member detached from the first cable management arm, and the connecting member previously at the first end portion of the first cable management arm also detached.
Figure 11:
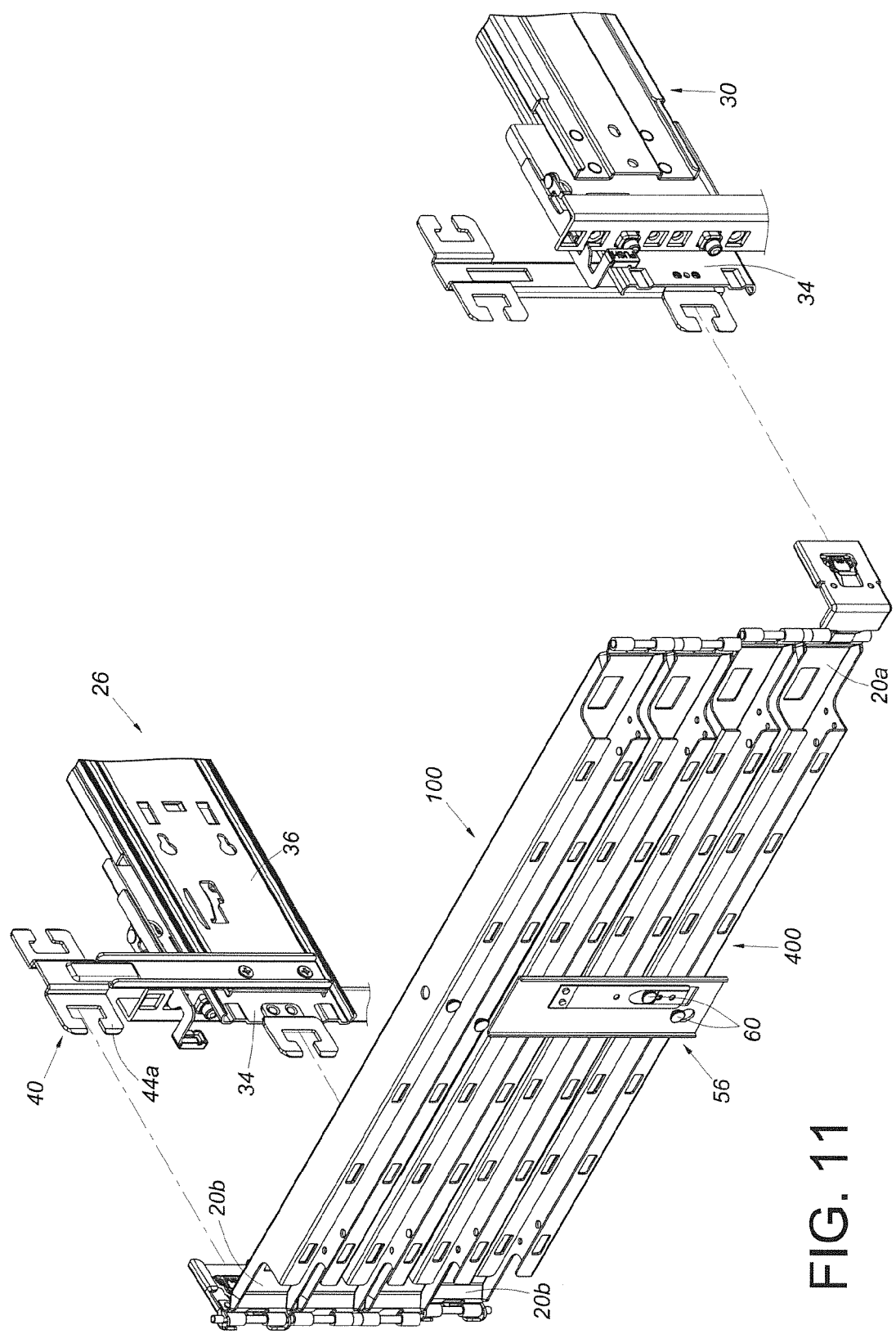
FIG. 11 is yet another perspective view of the cable management device in FIG. 8 after it is turned upside down, with the blocking member mounted to the fourth cable management arm, and the connecting member previously at the first end portion of the first cable management arm now mounted to the first end portion of the fourth cable management arm, showing that the fourth cable management arm can be connected to the first rails of a pair of slide rail assemblies, and that a portion of the first cable management arm can be connected to the auxiliary member of the second rail of one of the slide rail assemblies.

Further, as shown in FIG. 10 and FIG. 11, the blocking member 56 is detached from the mounting portions 60 of the first cable management arm 100 and mounted to the mounting portions 60 of the fourth cable management arm 400. Also, the connecting member 46 at the first end portion 20*a* of the first cable management arm 100 is detached and then mounted to the first end portion 20*a* of the fourth cable management arm 400. Thus, the first end portion 20*a* and the second end portion 20*b* of the fourth cable management arm 400 can be mounted to the first rails 34 of the second slide rail assembly 30 and of the first slide rail assembly 26 respectively, and the second end portion 20*b* of the first cable management arm 100 can be mounted to the connecting portion 44*a* of the auxiliary member 40 that is mounted to the second rail 36 of the first slide rail assembly 26. That is to say, the cable management device 20 of the present invention can be connected to and unfold along with the first slide rail assembly 26 as well as the second slide rail assembly 30 (see FIG. 3), thereby providing cable management on either the left or the right side.

Figure 12:
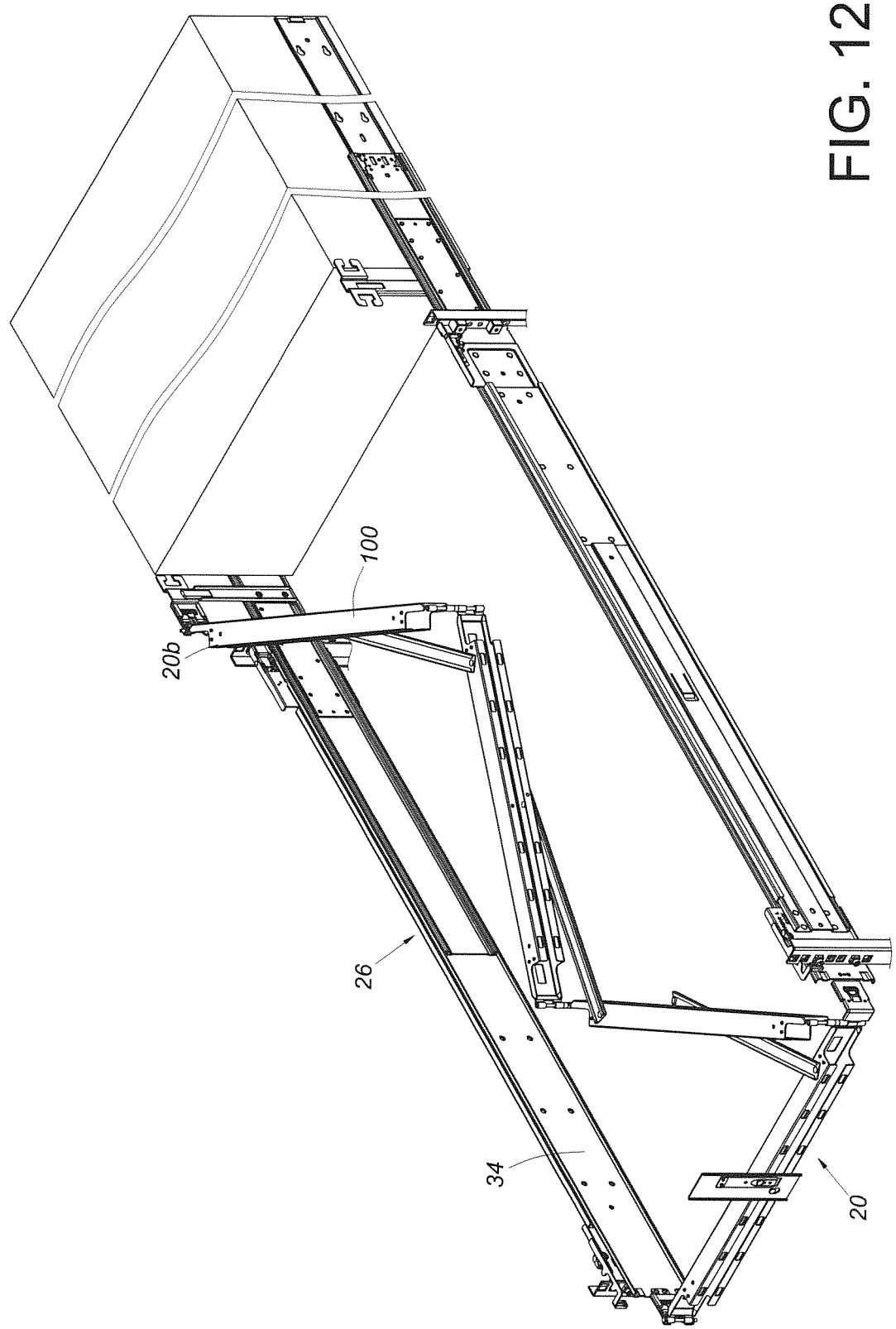
FIG. 12 is a perspective view showing that the first cable management arm of the cable management device in FIG. 11 is connected to the first slide rail assembly, and that the cable management device can be brought into an unfolded state by moving the second rail of the first slide rail assembly relative to the corresponding first rail.

As shown in FIG. 12, the second end portion 20*b* of the first cable management arm 100 of the cable management device 20 is so connected that, when the second rail 36 of the first slide rail assembly 26 is displaced relative to the corresponding first rail 34, the first cable management arm 100 is moved and brings the cable management device 20 into an unfolded state.

While the present invention has been disclosed through the foregoing preferred embodiments, the embodiments are not intended to be restrictive of the invention. The scope of patent protection sought by the applicant is defined by the appended claims.

What is claimed is:

1. A cable management device, comprising:
   a first cable management arm;
   a second cable management arm movably connected to the first cable management arm;
   a first rod attached between the first cable management arm and the second cable management arm, the first rod having a first portion and a second portion, wherein the first portion is connected to one of the first cable management arm and the second cable management arm, and the second portion is configured to be driven by the other of the first cable management arm and the second cable management arm, such that an unfolding angle of the second cable management arm with respect to the first cable management arm is kept within a predetermined range by the first rod;
   wherein the first cable management arm has a first end portion, and the second cable management arm has a first end portion pivotally connected to an upper part of the first cable management arm that is adjacent to the first end portion of the first cable management arm; and
   a third cable management arm and a fourth cable management arm, the fourth cable management arm being pivotally connected to an upper part of the third cable management arm, the second cable management arm having a second end portion, the third cable management arm being pivotally connected to an upper part of the second cable management arm that is adjacent to the second end portion of the second cable management arm.

2. The cable management device of claim 1, wherein the first portion of the first rod is pivotally connected to the first cable management arm, one of the first rod and the second cable management arm has a first guide groove, the other of the first rod and the second cable management arm has a first guide member attached thereto, and the first guide member is movably mounted in the first guide groove to enable relative movement of the first rod and the second cable management arm.

3. The cable management device of claim 2, wherein the first guide groove is disposed on the first rod, the first guide member is attached to the second cable management arm, and the second portion of the first rod forms a blocking portion at a predetermined position of the first guide groove such that the first guide member is movable in the first guide groove only within a range of movement between the first portion of the first rod and the second portion of the first rod.

4. The cable management device of claim 1, further comprising a second rod attached between the second cable management arm and the third cable management arm, the second rod having a first portion and a second portion, wherein the first portion of the second rod is connected to one of the second cable management arm and the third cable management arm, the second portion of the second rod is configured to be driven by the other of the second cable management arm and the third cable management arm, one of the second rod and the third cable management arm has a second guide groove, the other of the second rod and the third cable management arm has a second guide member attached thereto, and the second guide member is movably mounted in the second guide groove to enable relative movement of the second rod and the third cable management arm, such that an unfolding angle of the third cable management arm with respect to the second cable management arm is kept within a predetermined range by the second rod.

5. The cable management device of claim 4, wherein the second guide groove is disposed on the second rod, the second guide member is attached to the third cable management arm, and the second portion of the second rod forms a blocking portion at a predetermined position of the second guide groove such that the second guide member is movable in the second guide groove only within a range of movement between the first portion of the second rod and the second portion of the second rod.

6. The cable management device of claim 1, further comprising a third rod attached between the third cable management arm and the fourth cable management arm, the third rod having a first portion and a second portion, wherein the first portion of the third rod is connected to one of the third cable management arm and the fourth cable management arm, the second portion of the third rod is configured to be driven by the other of the third cable management arm and the fourth cable management arm, one of the third rod and the fourth cable management arm has a third guide groove, the other of the third rod and the fourth cable management arm has a third guide member attached thereto, and the third guide member is movably mounted in the third guide groove to enable relative movement of the third rod and the fourth cable management arm, such that an unfolding angle of the fourth cable management arm with respect to the third cable management arm is kept within a predetermined range by the third rod.

7. The cable management device of claim 6, wherein the third guide groove is disposed on the third rod, the third guide member is attached to the fourth cable management arm, and the second portion of the third rod forms a blocking portion at a predetermined position of the third guide groove such that the third guide member is movable in the third guide groove only within a range of movement between the first portion of the third rod and the second portion of the third rod.

8. A cable management device for use with a pair of slide rail assemblies, the cable management device comprising:
a first cable management arm having a first end portion and a second end portion respectively connected to the slide rail assemblies;
a second cable management arm having a first end portion and a second end portion, wherein the first end portion of the second cable management arm is movably connected to the first cable management arm at a position adjacent to the first end portion of the first cable management arm;
a third cable management arm movably connected to the second cable management arm at a position adjacent to the second end portion of the second cable management arm;
a first rod attached between the first cable management arm and the second cable management arm, the first rod having a first portion and a second portion, wherein the first portion of the first rod is connected to one of the first cable management arm and the second cable management arm, and the second portion of the first rod is configured to be driven by the other of the first cable management arm and the second cable management arm, such that an unfolding angle of the second cable management arm with respect to the first cable management arm is kept within a predetermined range by the first rod; and
a second rod attached between the second cable management arm and the third cable management arm, the second rod having a first portion and a second portion, wherein the first portion of the second rod is connected to one of the second cable management arm and the third cable management arm, and the second portion of the second rod is configured to be driven by the other of the second cable management arm and the third cable management arm.

9. The cable management device of claim 8, wherein the second cable management arm is movably connected to an upper part of the first cable management arm, and the third cable management arm is movably connected to an upper part of the second cable management arm.

10. The cable management device of claim 8, wherein the first portion of the first rod is pivotally connected to the first cable management arm, one of the first rod and the second cable management arm has a first guide groove, the other of the first rod and the second cable management arm has a first guide member attached thereto, and the first guide member is movably mounted in the first guide groove to enable relative movement of the first rod and the second cable management arm.

11. The cable management device of claim 10, wherein the first guide groove is disposed on the first rod, the first guide member is attached to the second cable management arm, and the second portion of the first rod forms a blocking portion at a predetermined position of the first guide groove such that the first guide member is movable in the first guide groove only within a range of movement between the first portion of the first rod and the second portion of the first rod.

12. The cable management device of claim 8, further comprising a fourth cable management arm, wherein the third cable management arm has a first end portion and a second end portion which correspond to each other, the second end portion of the third cable management arm is movably connected to an upper part of the second cable management arm at a position adjacent to the second end portion of the second cable management arm, and the fourth cable management arm is movably connected to an upper part of the third cable management arm at a position adjacent to the first end portion of the third cable management arm.

13. The cable management device of claim 12, further comprising a third rod attached between the third cable management arm and the fourth cable management arm, the third rod having a first portion and a second portion, wherein the first portion of the third rod is connected to one of the third cable management arm and the fourth cable management arm, and the second portion of the third rod is configured to be driven by the other of the third cable management arm and the fourth cable management arm.

14. The cable management device of claim 12, further comprising a blocking member detachably mounted to one of the first cable management arm and the fourth cable management arm, the blocking member having a height in order to provide a blocking effect when the second cable management arm and the third cable management arm of the cable management device are being folded relative to the first cable management arm.

15. The cable management device of claim 14, further comprising an elastic plate provided at the blocking member, each of the first cable management arm and the fourth cable management arm having a plurality of mounting portions for mounting the blocking member, the blocking member having a plurality of holes, the elastic plate corresponding to one of the holes, each said hole having a large-diameter portion and a small-diameter portion in communication with the large-diameter portion, the elastic plate having a stop wall provided adjacent to a border between the large-diameter portion and the small-diameter portion of the corresponding hole.

16. A cable management device adapted to managing cables of an object mounted between a second rail of a first slide rail assembly and a second rail of a second slide rail assembly in a rack-based system, the cable management device comprising:

a first cable management arm having a first end portion and a second end portion which correspond to each other, the first end portion and the second end portion of the first cable management arm being connected to a first rail of the first slide rail assembly and a first rail of the second slide rail assembly respectively;

a second cable management arm having a first end portion and a second end portion which correspond to each other, the first end portion of the second cable management arm being movably connected to the first end portion of the first cable management arm;

a third cable management arm having a first end portion and a second end portion which correspond to each other, the second end portion of the third cable management arm being movably connected to the second end portion of the second cable management arm;

a fourth cable management arm having a first end portion and a second end portion which correspond to each other, the first end portion of the fourth cable management arm being movably connected to the first end portion of the third cable management arm, the second end portion of the fourth cable management arm being connected to the second rail of one of the first and second slide rail assemblies or the object; and a first rod attached between the first cable management arm and the second cable management arm, a second rod attached between the second cable management arm and the third cable management arm, and a third rod attached between the third cable management arm and the fourth cable management arm.

17. The cable management device of claim 16, wherein the first end portion of the second cable management arm is movably connected to an upper part of the first end portion of the first cable management arm, the second end portion of the third cable management arm is movably connected to an upper part of the second end portion of the second cable management arm, and the first end portion of the fourth cable management arm is movably connected to an upper part of the first end portion of the third cable management arm.

18. The cable management device of claim 16, further comprising a blocking member detachably mounted to one of the first cable management arm and the fourth cable management arm, the blocking member having a height in order to provide a blocking effect when the second cable management arm and the third cable management arm of the cable management device are being folded relative to the first cable management arm.

* * * * *